United States Patent
Kawai et al.

(10) Patent No.: US 8,552,312 B2
(45) Date of Patent: Oct. 8, 2013

(54) PRINTED WIRING BOARD AND METHOD FOR MANUFACTURING PRINTED WIRING BOARD

(75) Inventors: Satoru Kawai, Ogaki (JP); Yasuki Kimishima, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 353 days.

(21) Appl. No.: 12/944,813

(22) Filed: Nov. 12, 2010

(65) Prior Publication Data

US 2011/0120762 A1 May 26, 2011

Related U.S. Application Data

(60) Provisional application No. 61/263,225, filed on Nov. 20, 2009.

(51) Int. Cl.
*H05K 1/11* (2006.01)

(52) U.S. Cl.
USPC .......................................... 174/264; 361/792

(58) Field of Classification Search
USPC ........................ 174/262–266; 361/792–795
See application file for complete search history.

(56) References Cited

U.S. PATENT DOCUMENTS

| | | |
|---|---|---|
| 2005/0048770 A1 | 3/2005 | Mashino |
| 2006/0144618 A1* | 7/2006 | Song et al. .................... 174/266 |

FOREIGN PATENT DOCUMENTS

| | | |
|---|---|---|
| JP | 2003-110241 A | 4/2003 |
| JP | 2005-72235 A | 3/2005 |
| JP | 2005-159043 A | 6/2005 |
| JP | 2005-310934 A | 11/2005 |
| JP | 2006-339350 A | 12/2006 |
| JP | 2008-214679 A | 9/2008 |
| JP | 4248353 B | 1/2009 |
| TW | 200738092 A | 10/2007 |

* cited by examiner

*Primary Examiner* — Jeremy Norris
(74) *Attorney, Agent, or Firm* — Oblon, Spivak, McClelland, Maier & Neustadt, L.L.P.

(57) ABSTRACT

A printed wiring board including a substrate having first and second surfaces and a penetrating hole extending through the substrate between the surfaces, a first conductive circuit on the first surface, a second conductive circuit on the second surface, and a through-hole conductor in the hole and connecting the first and second conductive circuits. The conductor includes an electroless plated film on the inner-wall surface of the hole, a first electrolytic plated film formed on the electroless plated film and forming a first opening portion opening on the first surface and a second opening portion opening on the second surface, a second electrolytic plated film filling the first portion, and a third electrolytic plated film filling the second portion. The first and second portions taper toward the central portion of the hole with respect to the axis direction of the hole and have cross sections forming a substantially U-shape, respectively.

15 Claims, 8 Drawing Sheets

PRINTED WIRING BOARD AND METHOD FOR MANUFACTURING PRINTED WIRING BOARD

CROSS-REFERENCE TO RELATED APPLICATIONS

The present application claims the benefits of priority to U.S. Application No. 61/263,225, filed Nov. 20, 2009. The contents of that application are incorporated herein by reference in their entirety.

BACKGROUND OF THE INVENTION

1. Field of the Invention

The present invention relates to a printed wiring board having a through-hole conductor formed by filling plating in a penetrating hole in an insulative substrate, and to its manufacturing method.

2. Discussion of the Background

In Japanese Patent Publication No. 4248353, a filling method is described for filling a penetrating hole for a through-hole conductor by plating. In Japanese Patent Publication No. 4248353, an electrolytic plating solution is used, whose speed of deposition onto the inner wall of a penetrating hole is faster than the speed of deposition onto the substrate surface. As shown in FIG. 1 of Japanese Patent Publication No. 4248353, a metal layer around the middle of a through hole is formed to be thicker than a metal layer around an opening portion of the through hole so that the portion around the middle will become the narrowest of the through hole. Furthermore, by continuing electrolytic plating, plating is deposited to plug the narrowest portion, and a through-hole conductor is formed. However, if the filling method in Japanese Patent Publication No. 4248353 is used, the narrowest portion, which is positioned around the middle of a through hole and is made of electrolytic plated film, has a cross-sectional V-shape, namely, a portion with an acute angle. Accordingly, when the narrowest portion of the through hole is plugged and then electrolytic plating is performed, performance of the plating solution may decrease at the acute-angle portion, leaving a void at the acute-angle portion. The contents of this publication are incorporated herein by reference in their entirety.

SUMMARY OF THE INVENTION

According to one embodiment of the present invention, a printed wiring board has a substrate having a first surface and a second surface on the opposite side of the first surface, the substrate having a penetrating hole extending through the substrate between the first surface and the second surface, a first conductive circuit formed on the first surface of the substrate, a second conductive circuit formed on the second surface of the substrate, and a through-hole conductor formed in the penetrating hole of the substrate and connecting the first conductive circuit and the second conductive circuit. The through-hole conductor includes an electroless plated film formed on the inner-wall surface of the penetrating hole, a first electrolytic plated film formed on the electroless plated film and forming a first opening portion which opens on the first surface and a second opening portion which opens on the second surface, a second electrolytic plated film filled in the first opening portion of the first electrolytic plated film, and a third electrolytic plated film filled in the second opening portion of the first electrolytic plated film. The first opening portion and the second opening portion taper toward the central portion of the penetrating hole with respect to the axis direction of the penetrating hole and have cross sections forming a substantially U-shape, respectively.

According to another aspect of the present invention, a method for manufacturing a printed wiring board includes providing a substrate having a first surface, a second surface on the opposite side of the first surface, and a penetrating hole extending through the substrate between the first surface and the second surface, forming an electroless plated film on an inner-wall surface of the penetrating hole, forming a first electrolytic plated film on the electroless plated film such that the first electrolytic plated film forms a first opening portion which opens on the first surface of the substrate and a second opening portion which opens on the second surface of the substrate and that the first opening portion and the second opening portion taper toward the central portion of the penetrating hole with respect to the axis direction of the penetrating hole and have cross sections forming a substantially U-shape, forming a second electrolytic plated film filling in the first opening portion of the first electrolytic plated film, and forming a third electrolytic plated film filling in the second opening portion of the first electrolytic plated film such that a through-hole conductor connecting a first conductive layer on the first surface of the substrate and a second conductive layer on the second surface of the substrate is formed in the penetrating hole of the substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

The embodiments will now be described with reference to the accompanying drawings, wherein like reference numerals designate corresponding or identical elements throughout the various drawings.

First Embodiment

Figure 1:
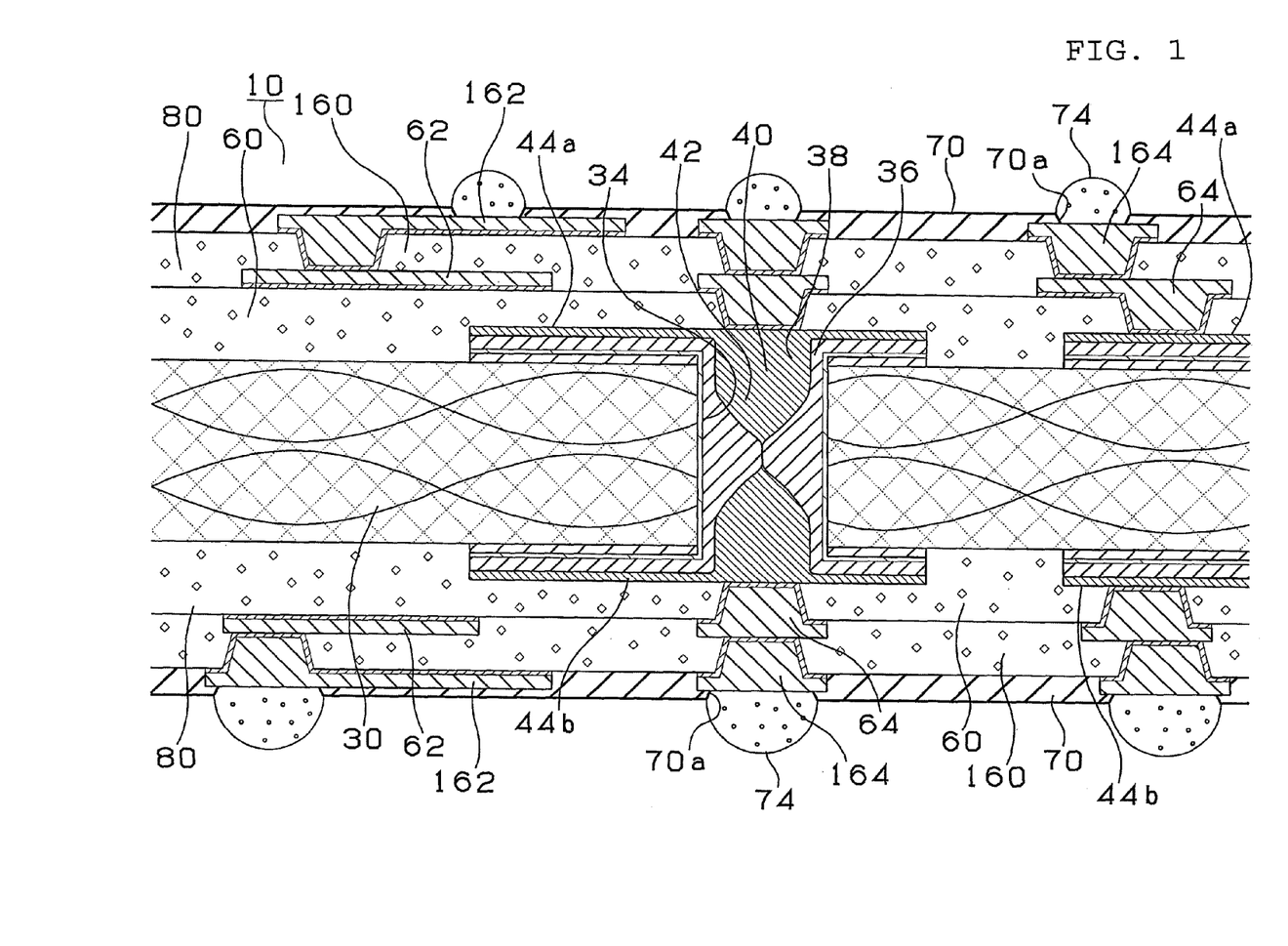
FIG. 1 is a cross-sectional view of a printed wiring board relating to the first embodiment of the present invention.

A printed wiring board relating to the first embodiment of the present invention is described with reference to FIGS. 1-4. FIG. 1 shows a printed wiring board relating to the first embodiment. Printed wiring board 10 has first conductive circuits (44a) on the upper surface (first surface) of insulative substrate 30, and second conductive circuits (44b) on the lower surface (second surface) of insulative substrate 30. First conductive circuits (44a) and second conductive circuits (44b) are connected by through-hole conductors 42 formed in penetrating holes 34 of insulative substrate 30.

On the first surface and second surface of insulative substrate 30, built-up layers 80 made by laminating interlayer resin insulation layers (60, 160) and conductive circuits (62, 162) are formed. Then, conductive circuits positioned in different layers are connected by means of via conductors (64, 164). Namely, first conductive circuits (44a) and third conductive circuits 62 are connected by means of via conductors (64, 164). Via conductors 64 are formed directly on through-hole conductors 42. Solder-resist layers 70 with opening portions (70a) are formed on outermost-layer conductive circuits 164 and on interlayer resin insulation layers 160. Bumps 74 are formed on via conductors and conductive circuits exposed through the opening portions of solder-resist layers 70.

Figure 2:
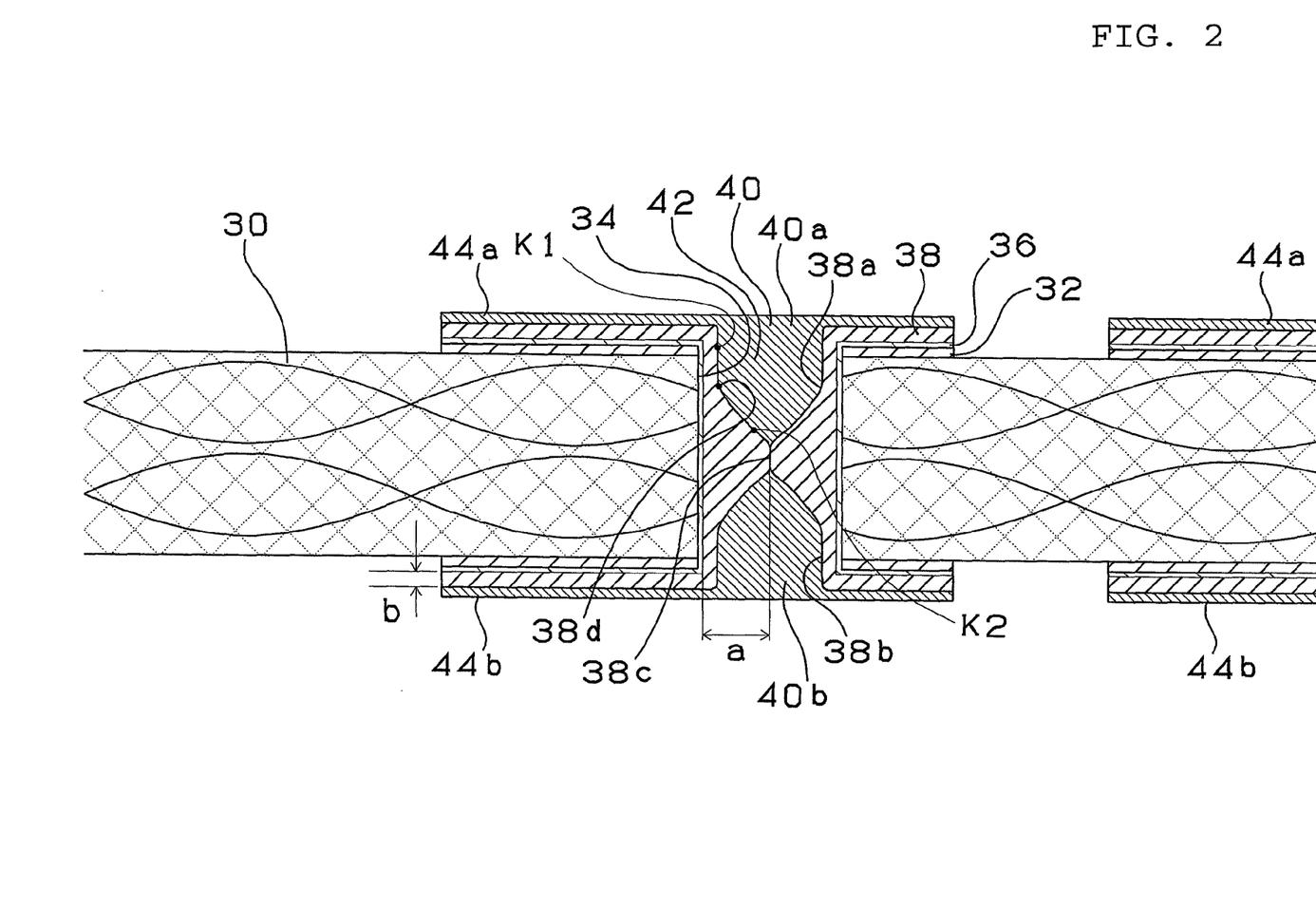
FIG. 2 is a cross-sectional view of an insulative substrate in a printed wiring board relating to the first embodiment.

FIG. 2 shows a cross-sectional view of insulative substrate 30. Through-hole conductor 42 has electroless plated film 36 formed on the inner-wall surface of penetrating hole 34, first electrolytic plated film 38 formed on electroless plated film 36 and having first opening portion (38a) and second opening portion (38b), second electrolytic plated film (40a) formed in first opening portion (38a) and third electrolytic plated film (40b) formed in second opening portion (38b). First electrolytic plated film 38 has connection portion (38c) which separates first opening portion (38a) and second opening portion (38b) in a substantially central part of the penetrating hole in the axis direction. First electrolytic plated film 38 is formed by pulse plating. The first opening portion opens on the first-surface side of insulative substrate 30, and tapers from the first surface toward the central part of the penetrating hole in the axis direction. The second opening portion opens on the second-surface side of insulative substrate 30, and tapers from the first surface toward the central part of the penetrating hole in the axis direction. The cross sections of the first opening portion and the second opening portion are formed substantially U-shaped.

The first electrolytic plated film has bent portion (38d) which changes the taper gradient of each opening portion. Namely, gradient (K1) from the open end of an opening portion toward bent portion (38d) is set smaller than gradient (K2) (the gradient of the connection portion) from bent portion (38d) toward the central part of the penetrating hole in the axis direction.

Figure 5:
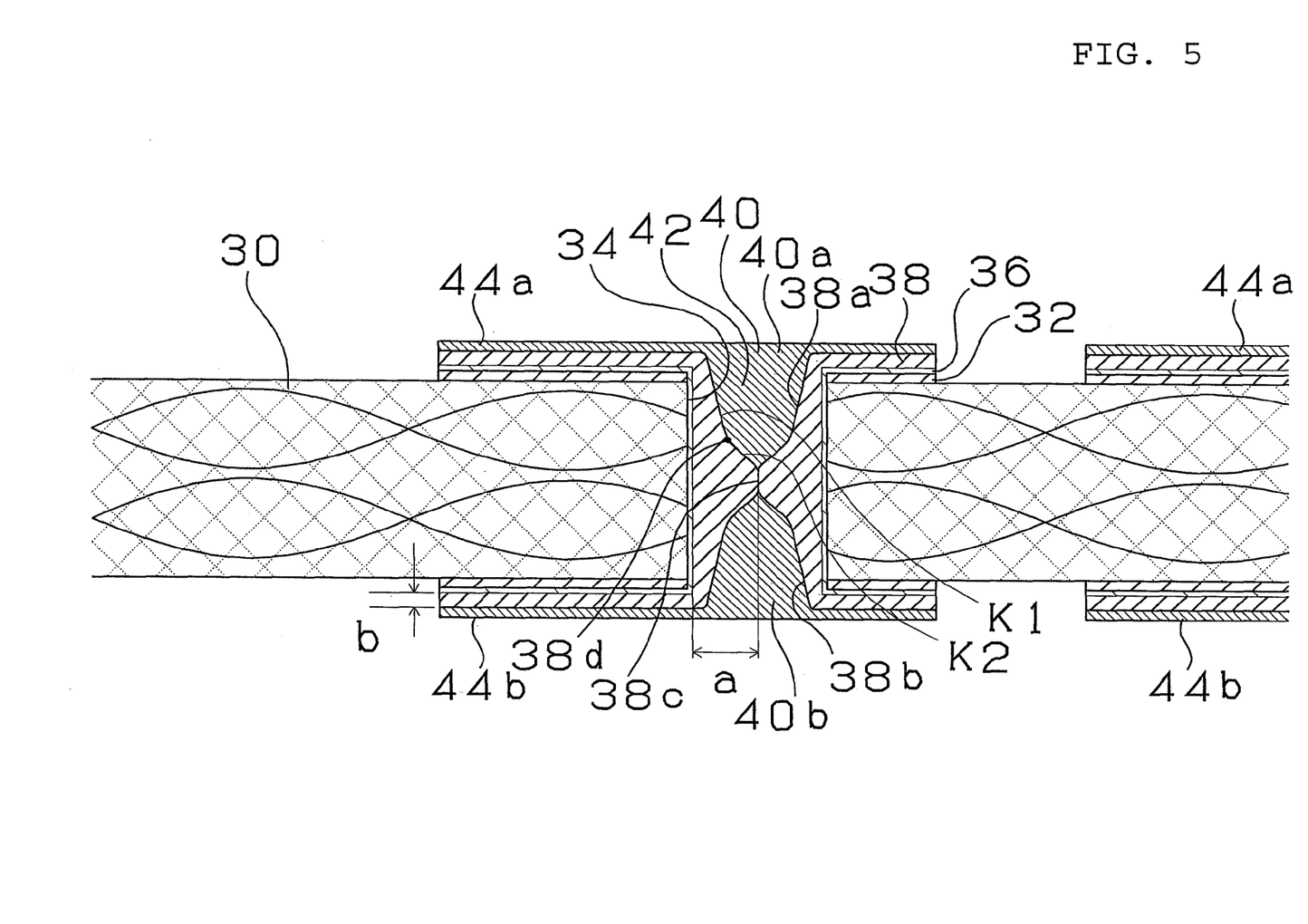
FIG. 5 is a cross-sectional view of an insulative substrate in a printed wiring board relating to the first embodiment.

Here, a "cross section" indicates a cross section obtained when slicing a penetrating hole with a straight line which passes through the approximate center of the penetrating hole and is perpendicular to the axis. Also, "substantially U-shaped" indicates a configuration that has a bent portion to change the taper gradient. For example, as shown in FIG. 2 and FIG. 5, gradient (K1) from the open end of an opening portion toward the bent portion is not limited to any specific degree.

The value of throwing power shown in percentage of thickness (a) of the first electrolytic plated film formed on the inner-wall surface of a penetrating hole to thickness (b) of the first electrolytic plated film formed on the first surface of the substrate [(a/b)×100] is 200% or greater. "Thickness (a)" indicates half the value of the thickness of the connection portion. In such a case, an opening portion with a bottom may be easily formed by increasing the thickness of the first electrolytic plated film deposited on the inner wall of a penetrating hole, while reducing the thickness of the first electrolytic plated film deposited on the surface of an insulative substrate. Namely, a penetrating hole is suppressed from being plugged with the first electrolytic plated film around the opening of the penetrating hole, and reducing the etching time may also be achieved when forming conductive circuits.

Second electrolytic plated film and third electrolytic plated film are formed by direct-current plating. Forming a second electrolytic plated film in the first opening portion and forming a third electrolytic plated film in the second opening portion are simultaneously performed. First conductive circuit (44a) (second conductive circuit (44b)) is formed with a copper foil formed on the insulative substrate, electroless plated film formed on the copper foil, the first electrolytic plated film formed on the electroless plated film and the second electrolytic plated film (the third electrolytic plated film) formed on the first electrolytic plated film.

The steps for manufacturing a printed wiring board of the first embodiment are described. In the present application, a method for forming a through-hole conductor is described especially in detail. The subsequent built-up layers and so forth may be manufactured using a conventionally known method.

Figure 3:
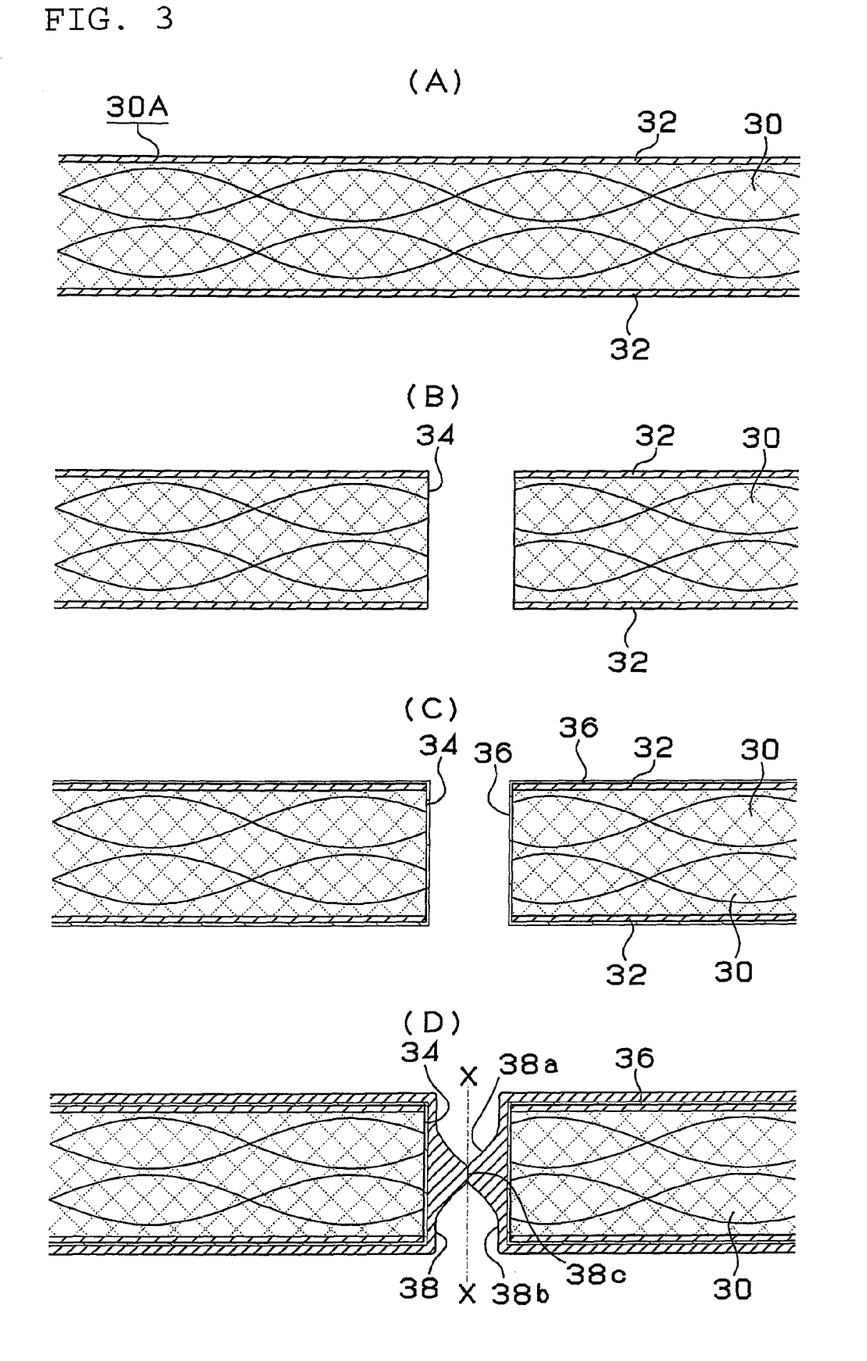
FIG. 3 are views showing the steps for manufacturing a printed wiring board of the first embodiment.

(1) Double-sided copper-clad laminate (30A) is prepared (FIG. 3(A)). Insulation layer (insulative substrate) 30 of the double-sided copper-clad laminate is made of glass-epoxy resin or BT (bismaleimide triazine) resin with an approximate thickness of 0.4 µm and a core material such as glass cloth. Copper foils (32, 32) are laminated on the upper surface and the lower surface of insulative substrate 30. Penetrating hole 34 with an approximate diameter of 100 µm is formed in the double-sided copper-clad laminate using a drill (FIG. 3(B)).

(2) Catalyst nuclei are attached to the surfaces of the double-sided copper-clad laminate and to the inner-wall surface of penetrating hole 34 (not shown in the drawings). Next, the insulative substrate with the attached catalyst is immersed in an electroless copper plating solution with the following composition and conditions. Accordingly, electroless copper-plated film 36 with a thickness of 0.3-3.0 µm is formed on the substrate surfaces and the inner wall of the penetrating hole (FIG. 3(C)).

electroless plating solution

| | |
|---|---|
| NiSO4 | 0.003 mol/l |
| tartaric acid | 0.200 mol/l |
| copper sulfate | 0.030 mol/l |
| HCHO | 0.050 mol/l |
| NaOH | 0.100 mol/l |
| α,α'-bipyridyl | 100 mg/l |
| polyethylene glycol | 0.10 g/l | electroless plating conditions

| | |
|---|---|
| time | 40 minutes |
| temperature | 34° C. |

(3) First electrolytic plated film 38 is formed in penetrating hole 34 and on both surfaces of insulative substrate 30 using an electrolytic plating solution with the following composition (FIG. 3(D)). First electrolytic plated film 38 is deposited to protrude from the inner-wall surface of a penetrating hole toward axis (X-X) (central part in the diameter direction) in the central part of the substrate in the thickness direction. Then, the tips are connected at the axis area and connection portion (38c) is formed. First electrolytic plated film 38 has a first opening portion which opens on the first-surface side of the insulative substrate, and a second opening portion which opens on the second-surface side of the insulative substrate. First electrolytic plated film 38 is formed by pulse plating.

electrolytic plating solution

| | |
|---|---|
| sulfuric acid | 0.5 mol/l |
| copper sulfate | 0.8 mol/l |
| iron sulfate | 5 g/l |
| leveling agent | 50 mg/l |
| brightener | 50 mg/l | electrolytic plating conditions

| | |
|---|---|
| temperature | 34 ± 2° C. |

Pulse plating in the present embodiment is described. During pulse plating in the present embodiment, anode electrolysis is performed on either the first-surface side or the second-surface side of insulative substrate 30, and cathode electrolysis is performed on the other of the first-surface side or the second-surface side of insulative substrate 30. The electrode polarities are periodically reversed. Namely, by performing plating on the upper-surface side (first-surface side) and lower-surface side (second-surface side) of insulative substrate 30 while properly alternating electrode polarities, plated film is deposited continuously on the central part of penetrating hole 34 in the axis direction, and first electrolytic plated film is deposited and dissolved repeatedly on the upper-surface side (first-surface side) and lower-surface side (second-surface side) of penetrating hole 34. As a result, opening portions with substantially U-shaped cross sections may be formed, while making relatively thicker first electrolytic plated film in the central part of penetrating hole 34, and making relatively thinner first electrolytic plated film on the first and second surfaces of penetrating hole 34.

(4) Second electrolytic plated film 40, which fills the opening portions formed by first electrolytic plated film 38, is formed by direct-current plating. An apparatus performing such direct-current plating is described with reference to FIG. 6.

Figure 6:
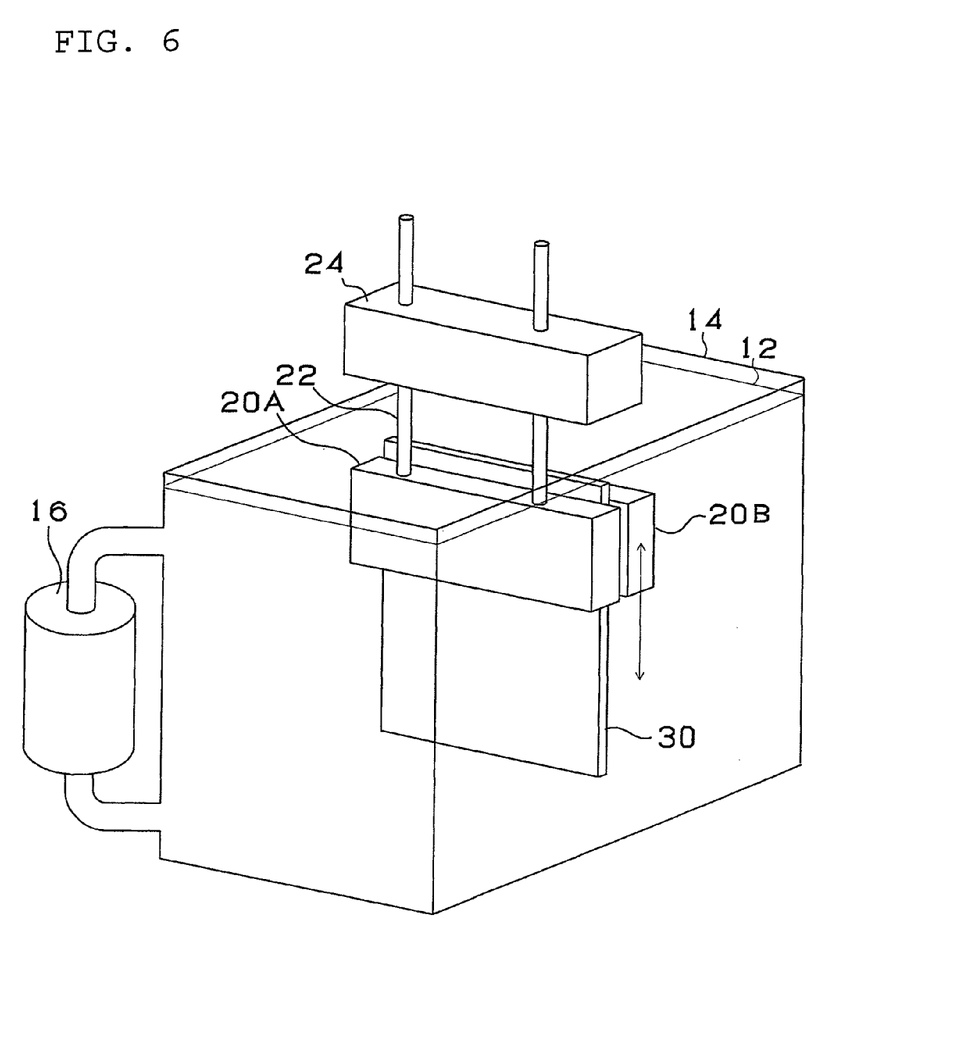
FIG. 6 is a view illustrating direct-current electroplating in the first embodiment.

FIG. 6 shows the structure of a direct-current plating apparatus relating to the first embodiment. The plating apparatus is formed with plating tank 14 filled with plating solution 12, circulation device 16 to circulate plating solution 12, insulative body (20A) made of porous resin (sponge) touching the upper-side plated surface (upper surface of substrate) of printed wiring board 30, insulative body (20B) made of sponge touching the lower-side plated surface (lower surface of substrate), and elevator device 24 to vertically transport insulative bodies (20A, 20B) along printed wiring board 30. Insulative bodies (20A, 20B) move by means of elevator bars 22 which are vertically transported by elevator device 24. Printed wiring board 20 is connected to the cathode side. Anode electrodes not shown in the drawing are prepared in the plating tank, and copper balls are accommodated in the anode electrodes.

The composition of plating solution 12 and plating conditions are as follows.

electrolytic plating solution

| | |
|---|---|
| sulfuric acid | 2.24 mol/l |
| copper sulfate | 0.26 mol/l |
| iron sulfate | 19.5 ml/l |
| leveling agent | 50 mg/l |
| brightener | 50 mg/l | electrolytic plating conditions

| | |
|---|---|
| current density | 1 A/dm2 |
| time | 65 minutes |
| temperature | 22 ± 2° C. |

Figure 4:
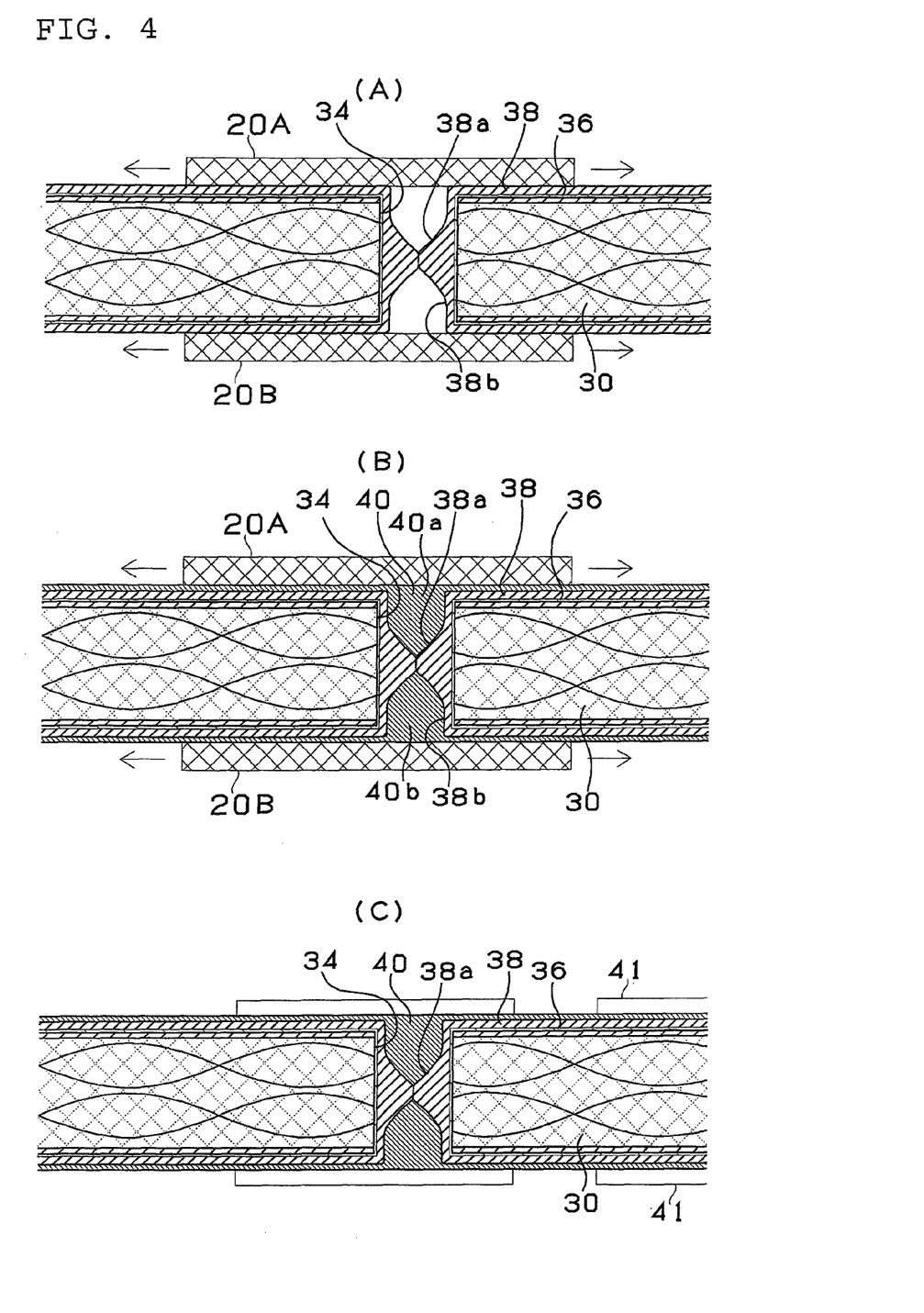
FIG. 4 are views showing the steps for manufacturing a printed wiring board of the first embodiment.

Forming second electrolytic plated film 40 using the plating apparatus is described with reference to FIGS. 4(A) and 4(B). First, insulative body (20A) is pressed against the upper surface of insulative substrate 30, and insulative body (20B) is pressed against the lower surface (FIG. 4(A)). The sizes (areas) of insulative bodies (20A, 20B) are adjusted to be 0.80 of that of the insulative substrate, and a ratio of the area where the insulative bodies contact the insulative substrate is adjusted to be 0.50. When the insulative bodies contact insulative substrate 30, after the insulative bodies touch the surfaces of the substrate, it is preferred that they be pushed 1.0-15.0 mm further into the surfaces (plating surfaces) of the substrate. If the amount to be pushed is less than 1.0 mm, the result tends to be the same as in a plating method performed without using insulative bodies. If the amount to be pushed exceeds 15.0 mm, the supply of the plating solution is inhibited, and the thickness of the plated film may tend to vary in the opening portions formed by first electrolytic plated film 38. From the viewpoint of minimizing the variations in the plated film on the substrate surfaces and inside opening portions, the amount to be pushed is most preferred to be 2-8 m. Then, the second electrolytic plated film formed on the substrate surfaces may be suppressed from being excessively thick.

The substrate and the insulative bodies are moved relative to each other while insulative bodies (20A, 20B) are touching insulative substrate 30 (FIG. 4(A)). The moving speed of the insulative bodies against the substrate is set at 7 m/min. Such moving speed is preferred to be set in the range of 1.0-16.0 m/min. Within such a range, the thickness of the second electrolytic plated film formed on substrate surfaces may be reduced. Furthermore, using insulative bodies, since the plating solution may be supplied into the opening portions formed by first electrolytic plated film 38, the inside of the opening portions may be filled easily with plating.

In the first embodiment, an insulative substrate is immersed in the above plating solution 12. Then, insulative bodies are pressed against the insulative substrate. While insulative bodies are pressed against the insulative substrate, insulative bodies and the substrate are moved relative to each other. While such a situation is maintained, electrolytic plated films (40a, 40b) are formed on the surfaces of substrate 30, and at the same time, electrolytic films (40a, 40b) are filled in the opening portions formed by first electrolytic plated film 38 in penetrating hole 34 (FIG. 4(B)).

The electrolytic plating solution may contain iron ions when first electrolytic plated film (40a) and second electrolytic plated film (40b) are formed. In such a case, since insulative bodies contact the plating surfaces, the growth speed of plated film is slow in the contact areas. Especially, insulative bodies force iron ions to be supplied to plating interfaces and cause a reduction reaction of iron ions, thus suppressing copper from being deposited.

On the other hand, in areas not contacted by insulative bodies, iron ions are only diffused on plating interfaces due to a concentration gradient, but will not be forced to be supplied. Thus, the reduction reaction of iron ions is low and the growth speed of plating is fast. Therefore, plating in the opening portions grows, whereas the plating film on the plating surfaces except for the opening portions will not become too thick. Accordingly, etching time may be reduced when forming conductive circuits, and highly integrated conductive circuits may be formed.

(5) After second electrolytic plated film 40 is formed, etching resists 41 with a predetermined pattern are formed (FIG. 4(C)).

(6) Second electrolytic film 40, first electrolytic plated film 38, electroless plated film 36 and copper foil 32, which are left exposed by the etching resists, are dissolved through etching. After that, the etching resists are removed and conductive circuits (44a, 44b) are formed (FIG. 2). First conductive circuit (44a) and second conductive circuit (44b) are connected by through-hole conductor 42.

In a printed wiring board of the first embodiment, when electrolytic plating is conducted inside penetrating hole 34, a first electrolytic plated film having a first opening portion and a second opening portion is first formed, and then a second electrolytic plated film is formed in the first opening portion and a third electrolytic plated film is formed in the second opening portion. Since both opening portions are formed to have substantially U-shaped cross sections, when the second electrolytic plated film and the third electrolytic plated film are formed, the plating solution flows smoothly along the gently curved wall surfaces and tends to circulate well. Thus, voids are seldom formed when plating is deposited. Accordingly, the strength and connection reliability of the through-hole conductor may be easily achieved. In addition, the surface flatness of the through-hole conductor (through-hole land) will improve, and it is thought that reliability will not decrease when a via conductor is positioned directly on the through-hole conductor.

In a penetrating hole of the present embodiment formed by using a drill, namely in a penetrating hole having diameters substantially the same in the axis direction, if pulse plating is used as described above, opening portions having the most suitable shape for filling with plating may also be formed. Moreover, the thickness of plating on the surfaces of an insulative substrate may be remarkably suppressed from increasing.

The diameter of a penetrating hole for a through-hole conductor is preferred to be set at 80-250 μm. If the diameter is less than 80 μm, it is difficult to form substantially U-shaped cross sections even if the first electrolytic plated film is formed by pulse plating. On the other hand, if the diameter exceeds 250 μm, it is difficult to form a connection portion in the central part of a penetrating hole even if the first electrolytic plated film is formed by pulse plating.

Also, the aspect ratio of a penetrating hole for a through hole is preferred to be set in the range of 1-7. If the ratio exceeds seven, it is difficult to form substantially U-shaped cross sections even if the first electrolytic plated film is formed by pulse plating. On the other hand, if the ratio is less than one, it is difficult to form a connection portion in the central part of a penetrating hole even if the first electrolytic plated film is formed by pulse plating.

The value of throwing power shown in percentage of thickness (a) of the first electrolytic plated film formed on the inner-wall surface of a through hole to thickness (b) of the first electrolytic plated film formed on the substrate surfaces [(a/b)×100] is preferred to be 200% or greater. In such a case, opening portions with bottoms may be easily formed by increasing the thickness of the first electrolytic plated film deposited on the inner wall of a penetrating hole, while reducing the thickness of the first electrolytic plated film deposited on the surfaces of an insulative substrate. Namely, a penetrating hole is suppressed from being plugged with the first electrolytic plated film around the openings of the penetrating hole, and reducing the etching time may also be achieved when forming conductive circuits.

A Modified Example of the First Embodiment

The second electrolytic plated film and the third electrolytic plated film may be formed by pulse plating.

Second Embodiment

A method for manufacturing a printed wiring board relating to the second embodiment of the present invention is described with reference to FIGS. 7 and 8. In the second embodiment, a penetrating hole in the insulative substrate is formed by using a laser.

Figure 7:
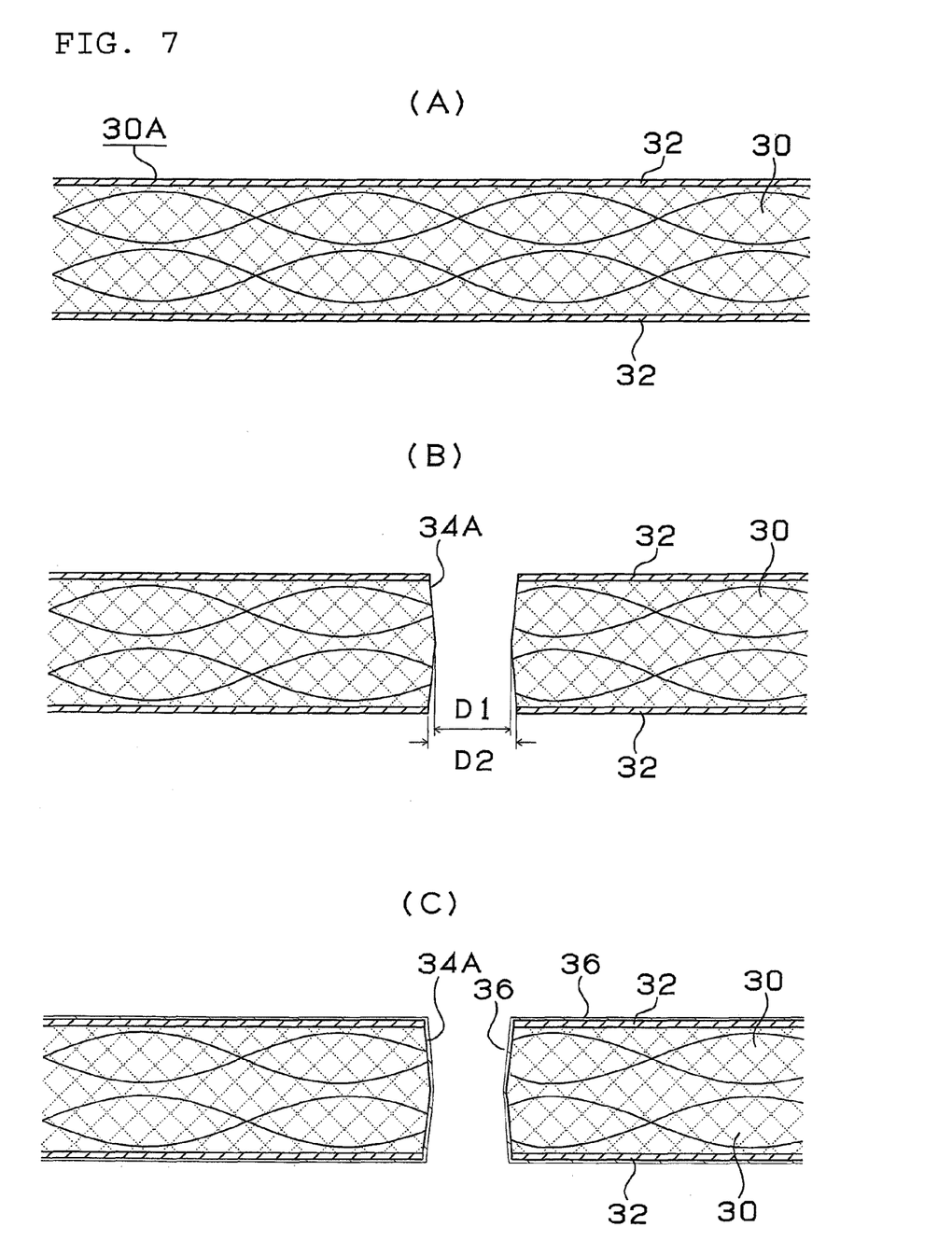
FIG. 7 is views showing the steps for manufacturing a printed wiring board relating to the second embodiment of the present invention.

(1) Double-sided copper-clad laminate (30A) is prepared (FIG. 7(A)). First, using a laser, by forming an opening from the upper surface of the double-sided copper-clad laminate, while forming an opening from the lower surface, penetrating hole 34 with an hourglass-shaped cross section is formed, having an opening-diameter of approximately 90 μm and a central diameter (the smallest diameter) of approximately 60 μm (FIG. 7(B)). Smallest diameter (D1) and opening diameter (D2) of penetrating hole 34 are preferred to satisfy D1/D2=¼-9/10. If (D1/D2) is in such a range, filling the inside of penetrating hole 34 with plating becomes easier.

(2) Next, smears or the like remaining on the inner surface of penetrating hole 34 are removed by using a permanganate method. Then, catalyst nuclei are attached to the surfaces of the double-sided copper-clad laminate and the inner-wall surface of penetrating hole 34 for a through-hole (not shown in the drawings). Next, electroless copper-plated film 36 is formed on the substrate surfaces and the inner wall of the penetrating hole (FIG. 7(C)).

Figure 8:
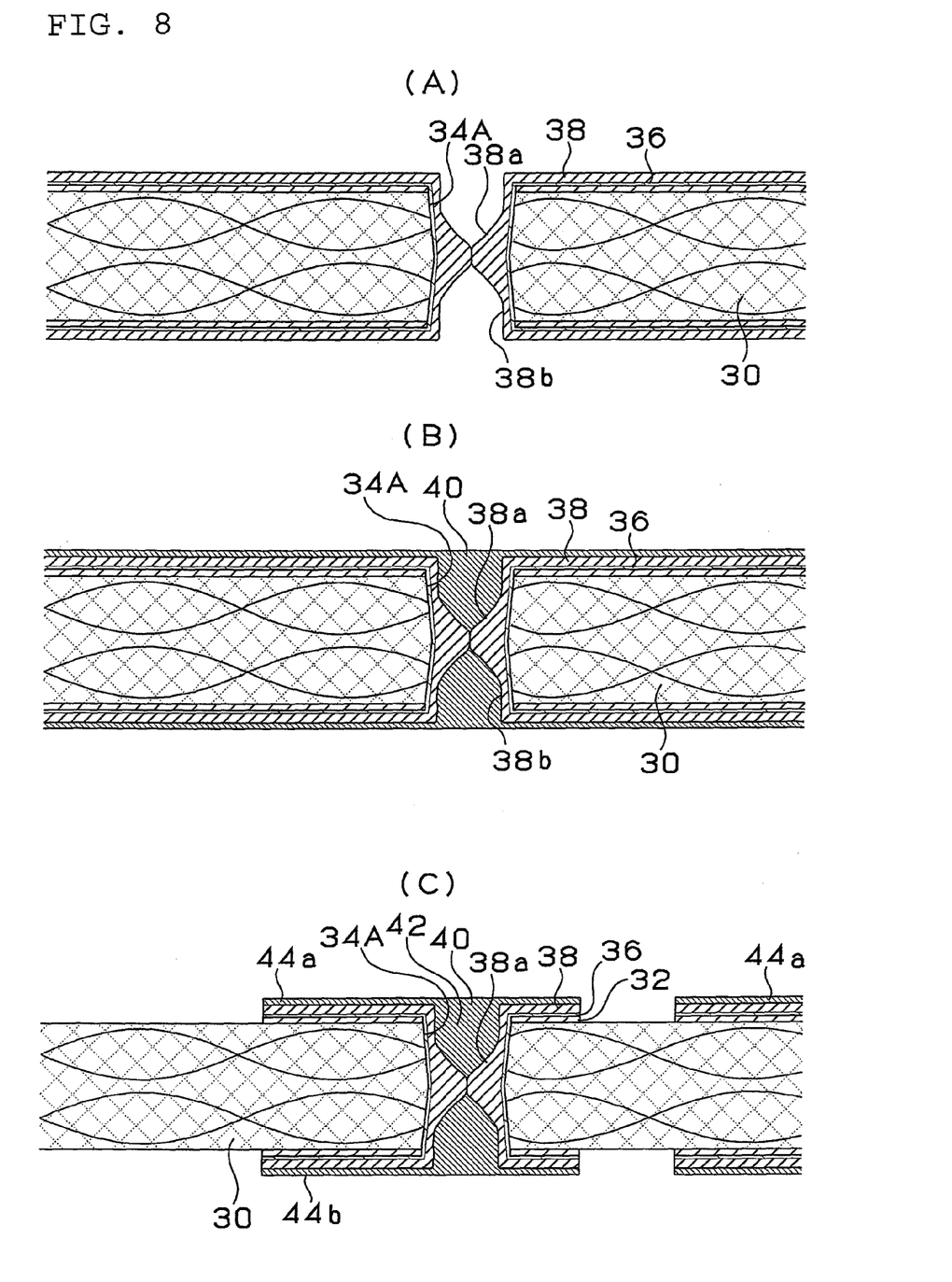
FIG. 8 are views showing the steps for manufacturing a printed wiring board of the second embodiment.

(3) First electrolytic plated film 38 is formed inside penetrating hole 34 and on both surfaces of insulative substrate 30, the same as in the above first embodiment (FIG. 8(A)). First electrolytic plated film 38 has first opening portion (38a) which opens on the first-surface side of insulative substrate 30 and second opening portion (38b) which opens on the second-surface side.

(4) Second electrolytic plated film 40, which fills the opening portions formed by first electrolytic plated film 38, is formed by direct-current plating (FIG. 8(B)). Here, unlike the first embodiment, plating is performed without making contact with the insulative bodies.

(5) After second electrolytic plated film 40 is formed, etching resists with a predetermined pattern are formed (not shown in the drawings). Then, second electrolytic plated film 40, first electrolytic plated film 38, electroless plated film 36 and copper foil 32, which are left exposed by the etching resists, are dissolved by etching. Next, the etching resists are removed, and conductive circuits (44a, 44b) and through-hole conductor 42 are completed (FIG. 8(C)).

Modified Example of the Second Embodiment

Second electrolytic plated film and third electrolytic plated film may also be formed by pulse plating.

According to one embodiment of the present invention, a printed wiring board is formed with the following: a substrate having a first surface, a second surface opposite the first surface and a penetrating hole; a first conductive circuit formed on the first surface of the substrate; a second conductive circuit formed on the second surface of the substrate; and a through-hole conductor made of plating filled in the penetrating hole and connecting the first conductive circuit and the second conductive circuit. Such a printed wiring board has the following technical features: the through-hole conductor is formed with an electroless plated film formed on the inner-wall surface of the penetrating hole, a first electrolytic plated film formed on the electroless plated film and having a first opening portion which opens on the first surface and a second opening portion which opens on the second surface, a second electrolytic plated film filled in the first opening portion, and a third electrolytic plated film filled in the second opening portion; and the first opening portion and the second opening portion taper toward the central part of the penetrating hole in the axis direction, and have cross sections formed to be substantially U-shaped.

In such a printed wiring board and a method for manufacturing the printed wiring board, a through-hole conductor is formed by forming a first electrolytic plated film having a first opening portion and a second opening portion whose cross sections are formed to be substantially U-shaped, and by further filling electrolytic plated film in the first opening portion and the second opening portion. Namely, since the cross sections of the first opening portion and the second opening portion are substantially U-shaped, no acute-angle portion is formed, and the plating solution will flow smoothly when electrolytic plated film is formed inside the opening portions. Therefore, voids seldom remain in each opening portion. As a result, cracks originating at voids rarely occur in the through-hole conductor, and connection reliability may be secured between the first conductive circuit and the second conductive circuit. Furthermore, flatness features will improve on the surface of a through-hole conductor (through-hole land), and connection reliability will not decrease if a via is positioned directly on the through-hole land. Also, by suppressing voids, areas with thinner plating will not be formed. Thus, there is little fear that the strength of a through-hole conductor will decrease.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board comprising:
   a substrate having a first surface and a second surface on an opposite side of the first surface, the substrate having a penetrating hole extending through the substrate between the first surface and the second surface;
   a first conductive circuit formed on the first surface of the substrate;
   a second conductive circuit formed on the second surface of the substrate; and
   a through-hole conductor formed in the penetrating hole of the substrate and connecting the first conductive circuit and the second conductive circuit,
   wherein the through-hole conductor comprises an electroless plated film formed on an inner-wall surface of the penetrating hole, a first electrolytic plated film formed on the electroless plated film and forming a first opening portion which opens on the first surface, a second opening portion which opens on the second surface and a connection portion partitioning the first opening portion and the second opening portion, a second electrolytic plated film filled in the first opening portion of the first electrolytic plated film, and a third electrolytic plated film filled in the second opening portion of the first electrolytic plated film, and the first opening portion and the second opening portion taper toward a central portion of the penetrating hole with respect to an axis direction of the penetrating hole and have cross sections forming a substantially U-shape, respectively.

2. The printed wiring board according to claim 1, wherein the first electrolytic plated film is formed by pulse plating.

3. The printed wiring board according to claim 1, wherein the second electrolytic plated film and the third electrolytic plated film are formed by direct-current plating.

4. The printed wiring board according to claim 1, wherein the first electrolytic plated film has bent portions which change taper gradients of the first and second opening portions.

5. The printed wiring board according to claim 1, wherein the first electrolytic plated film has bent portions which change taper gradients of the first and second opening portions, the first and second opening portions have first taper gradients from open ends of the first and second opening portions toward the bent portions and second taper gradients from the bent portions toward bottom portions of the first and second opening portions, and the first taper gradients are smaller than the second taper gradients.

6. The printed wiring board according to claim 1, wherein the second electrolytic plated film and the third electrolytic plated film are simultaneously formed.

7. The printed wiring board according to claim 1, wherein the first electrolytic plated film has a throwing power satisfying that $(a/b) \times 100$ is equal to or greater than 200%, where a is a thickness of the first electrolytic plated film formed on the inner-wall surface of the penetrating hole and b is a thickness of the first electrolytic plated film formed on the first surface of the substrate.

8. The printed wiring board according to claim 1, wherein the aspect ratio of the penetrating hole has an aspect ratio which is in a range of 1 to 7.

9. The printed wiring board according to claim 1, wherein the penetrating hole has a diameter which is substantially same from the first surface to the second surface of the substrate with respect to the axis direction of the penetrating hole.

10. A method for manufacturing a printed wiring board, comprising:
   providing a substrate having a first surface, a second surface on an opposite side of the first surface, and a penetrating hole extending through the substrate between the first surface and the second surface;
   forming an electroless plated film on an inner-wall surface of the penetrating hole;
   forming a first electrolytic plated film on the electroless plated film such that the first electrolytic plated film forms a first opening portion which opens on the first surface of the substrate, a second opening portion which opens on the second surface of the substrate and a connection portion partitioning the first opening portion and the second opening portion and that the first opening portion and the second opening portion taper toward a central portion of the penetrating hole with respect to an axis direction of the penetrating hole and have cross sections forming a substantially U-shape, respectively;
   forming a second electrolytic plated film filling in the first opening portion of the first electrolytic plated film; and
   forming a third electrolytic plated film filling in the second opening portion of the first electrolytic plated film such that a through-hole conductor connecting a first conductive layer on the first surface of the substrate and a second conductive layer on the second surface of the substrate is formed in the penetrating hole of the substrate.

11. The method for manufacturing a printed wiring board according to claim 10, wherein the first electrolytic plated film is formed by pulse plating.

12. The method for manufacturing a printed wiring board according to claim 10, wherein the second electrolytic plated film and the third electrolytic plated film are formed by direct-current plating.

13. The method for manufacturing a printed wiring board according to claim 10, wherein the forming of the second electrolytic plated film in the first opening portion and the forming of the third electrolytic plated film in the second opening portion are carried out at the same time.

14. The method for manufacturing a printed wiring board according to claim 10, wherein the first electrolytic plated film has bent portions which change taper gradients of the first and second opening portions.

15. The method for manufacturing a printed wiring board according to claim 10, wherein the forming of the first electrolytic plated film comprises carrying out pulse plating while periodically alternating electrode polarities at the first surface of the substrate and at the second surface of the substrate.

* * * * *